United States Patent
Shay et al.

(10) Patent No.: US 9,887,680 B2
(45) Date of Patent: Feb. 6, 2018

(54) DUAL-MODE FILTERING ACTUATOR DRIVER APPARATUS, SYSTEMS AND METHODS

(71) Applicant: TEXAS INSTRUMENTS INCORPORATED, Dallas, TX (US)

(72) Inventors: Michael John Shay, Fairview, TX (US); Jialei Xu, Cupertino, CA (US); Randy A. Chappel, Quinlan, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 337 days.

(21) Appl. No.: 14/558,718

(22) Filed: Dec. 2, 2014

(65) Prior Publication Data
US 2016/0156337 A1 Jun. 2, 2016

(51) Int. Cl.
| | |
|---|---|
| *H03H 1/02* | (2006.01) |
| *H03H 9/00* | (2006.01) |
| *H03H 11/04* | (2006.01) |
| *H03H 1/00* | (2006.01) |

(52) U.S. Cl.
CPC ............ *H03H 1/02* (2013.01); *H03H 1/0007* (2013.01); *H03H 9/00* (2013.01); *H03H 11/04* (2013.01)

(58) Field of Classification Search
CPC .. H03H 1/02; H03H 21/0007; H03H 21/0014; H03H 11/06; H03H 1/0007; H03H 11/04; H03H 9/00
USPC ........................................ 333/172, 17.1, 186
See application file for complete search history.

(56) References Cited

U.S. PATENT DOCUMENTS 4,710,686 A * 12/1987 Guzik ............... H02M 7/53871
318/293
8,482,340 B2   7/2013 Shay et al.

* cited by examiner

*Primary Examiner* — Rakesh Patel
(74) *Attorney, Agent, or Firm* — Michael A. Davis, Jr.; Charles A. Brill; Frank D. Cimino (57) ABSTRACT

A dual-mode driver includes a transition stage and a static stage. The transition stage switches a bias voltage or an RF ground potential to an output pad to change the state of an RF actuator device connected at the output pad. After waiting a predetermined period of time for the RF actuator device to change state, the transition stage of the driver is disabled. A high-side or low-side static stage transistor maintains the driver output state through an isolation resistor. The isolation resistor and a capacitor formed at the driver output pad form an RC low-pass filter to block spurious noise generated at the driver. The RC filter also blocks RF energy that might otherwise enter the actuator driver from the actuator. Some embodiments also include a second RC filter located proximate to the output pad to prevent RF energy generated in the RF actuator from entering the driver.

14 Claims, 7 Drawing Sheets

DUAL-MODE FILTERING ACTUATOR DRIVER APPARATUS, SYSTEMS AND METHODS

TECHNICAL FIELD

Embodiments described herein relate to apparatus, systems and methods associated with electronically driving actuator apparatus including radio frequency switches.

BACKGROUND INFORMATION

Arrays of radio frequency ("RF") switches are used in the fields of communication, test and instrumentation, and RF microphones, among others. Such RF switch arrays are increasingly implemented using RF micro-electromechanical ("MEMS") devices. RF MEMS devices in this context may include MEMS arrays of tunable inductors, switched capacitors, and varactors in addition to simple switches. RF switching arrays implemented with RF MEMS devices include the advantages of compact size and low power dissipation. Although the switching element input voltage for such devices is relatively high for semiconductor devices (e.g., typically 30-40 volts DC), each MEMS element requires only a small or near-zero drive current to maintain its state following a state transition.

The design of electronic drivers for the above-described RF switch arrays can present challenges. RF energy from driven devices may conduct back from an RF switching element in the array to the driver for that element. The RF energy may generate inter-modulation products through mixing within the driver transistors. The inter-modulation products may reflect back out into the RF channel. Conversely, spurious noise from driver elements may leak into the RF switch array. The latter driver-initiated interference is referred to hereinafter as "spurious noise." Spurious noise may include, for example, noise from a power supply providing the high drive voltage to bias the RF switch elements.

Spurious noise leakage may cause subtle but significant variations in sensitive parameters such as the capacitance of a MEMS varactor element or result in inter-modulation distortion by mixing the baseband with the RF band carrier.

SUMMARY OF THE INVENTION

Structures and methods disclosed herein provide transition and statically held drive signals to an RF actuator device or to an array of RF actuator devices such as may be included in a MEMS array. A dual-mode driver includes a transition stage and a static stage. The transition stage switches a high bias voltage to an output pad directly from a high voltage power supply rail in order to change the state of an RF actuator device connected at the driver output pad. "High voltage" and "high bias voltage" in the context of this disclosure means a voltage in the range of 30-40 volts DC as is typically used in the art for state changes of MEMS elements. Likewise, the transition stage of the dual-mode driver switches the output pad directly to an RF ground potential in order to transition the state of the connected RF actuator device.

After waiting a predetermined period of time for the RF actuator device to change state, the transition stage of the dual-mode driver is disabled. A high-side or low-side static stage transistor maintains the state of the driver output voltage previously transitioned-to through an isolation resistor. The isolation resistor and a capacitor formed at the driver output pad form an RC low-pass filter to block spurious noise generated at the driver and/or within the switching circuitry associated with the driver high voltage power supply. The RC low-pass filter also blocks RF energy from the RF actuator that might otherwise enter into and disrupt operation of the actuator driver.

Some embodiments also include a second RC filter termed "pad filter" herein. The pad filter is formed proximate to the output pad as further described below. The pad filter serves to filter RF energy generated in RF circuitry switched or controlled by the actuator and helps to prevent such energy from entering the actuator driver.

DETAILED DESCRIPTION

Figure 1:
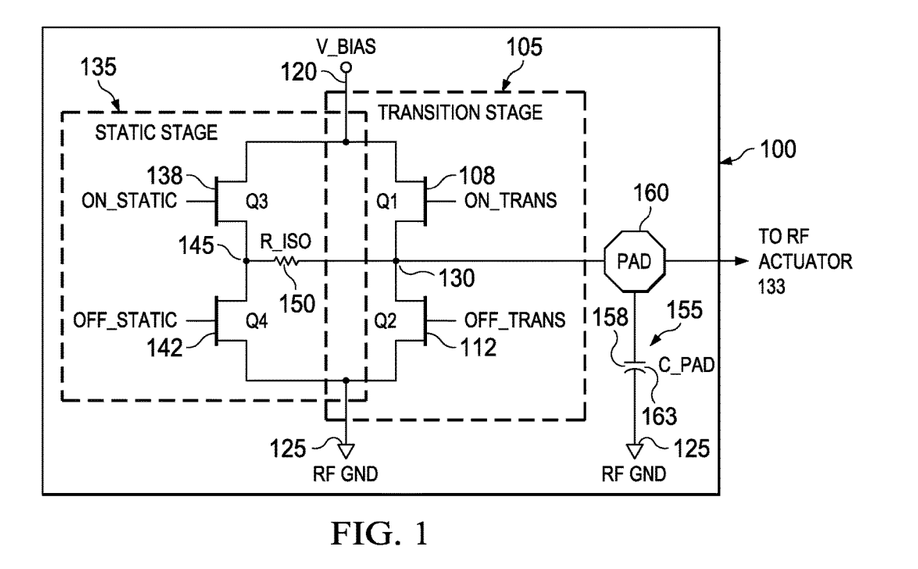
FIG. 1 is a schematic diagram of a dual-mode filtering actuator driver apparatus according to various example embodiments of the invention.

FIG. 1 is a schematic diagram of a dual-mode filtering actuator driver apparatus 100 according to various example embodiments of the invention. The driver 100 includes a transition stage 105. The transition stage 105 includes two or more transition stage transistors (e.g., the transistors Q1 108 and Q2 112). The transition stage transistors 108 and 112 are coupled in series between a power supply voltage rail 120 and an RF ground rail 125 and are joined at an output node 130. One or more of the transition stage transistors conducts during a state change at the output node 130 and are turned off at the end of a predetermined period of time after the state change. A DC voltage associated with the power supply rail 120 is substantially equal to an actuation bias voltage associated with an actuator 133 to be controlled by the driver 100.

The actuator driver 100 also includes a static stage 135. The static stage 135 includes two or more static stage transistors (e.g., the transistors Q3 138 and Q4 142). The static stage transistors 138 and 142 are coupled in series between the supply voltage rail 120 and the RF ground rail 125 and are joined at an isolation node 145. One or more of the static stage transistors continues to conduct following the predetermined period of time after the state change in order to maintain the state change after the transition stage 105 becomes inactive.

The actuator driver 100 further includes an isolation resistor 150 coupled between the isolation node 145 and the output node 130. The driver 100 also includes a pad capacitor 155. A first terminal 158 of the pad capacitor 155 is located at a connector pad 160. The connector pad 160 is communicatively coupled to the output node 130. A second terminal 163 of the pad capacitor 155 is coupled to the RF ground rail 125. The isolation resistor 150 and the pad capacitor 155 form a low-pass filter to filter RF harmonics from the actuator driver 100 to circuitry associated with the actuator 133. The low-pass filter formed by the isolation resistor 150 and the pad capacitor 155 also filters RF energy generated outside of the actuator driver 100 at the connector pad 160.

Various RF actuator devices 133 may be controlled by the actuator driver 100. The RF actuator device 133 may, for example, be an element of a MEMS array such as a MEMS RF switching array, a MEMS tunable inductor array, a MEMS capacitor array, a MEMS switched capacitor array or a MEMS varactor array.

Figure 2:
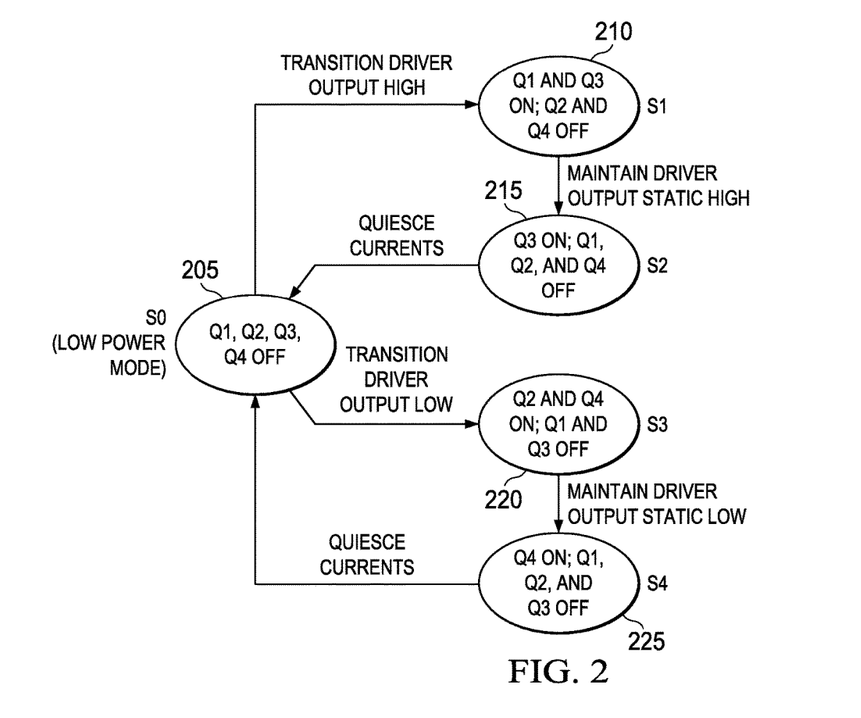
FIG. 2 is a state diagram illustrating various example states of a dual-mode filtering actuator driver apparatus.

FIG. 2 is a state diagram illustrating various example states of the dual-mode filtering actuator driver apparatus 100. With no transistors conducting, the driver 100 is in a low power state S0 205 and the output node 130 is at a high impedance level. To transition the output node 130 high from state S0 205, transistors Q1 108 and Q3 138 are turned on and transistors Q2 112 and Q4 142 are turned off at state S1 210. Transistor Q1 108 is then turned off after the driven actuator 133 has had time to change state, resulting in a static ON state S2 215 of the driver 100. The low-pass RC filter made up of the isolation resistor 150 and the pad capacitor 155 also becomes active at S2 215 as the isolation resistor 150 is placed in series with the output path.

To transition the output node 130 low from state S0 205, transistors Q2 112 and Q4 142 are turned on and transistors Q1 108 and Q3 138 are turned off at state S3 220. Transistor Q2 112 is then turned off after the driven actuator 133 has had time to change state, resulting in a static OFF state S4 225 of the driver 100. The low-pass RC filter also becomes active at S4 225 as the isolation resistor 150 is placed in series with the output path.

Figure 3A:
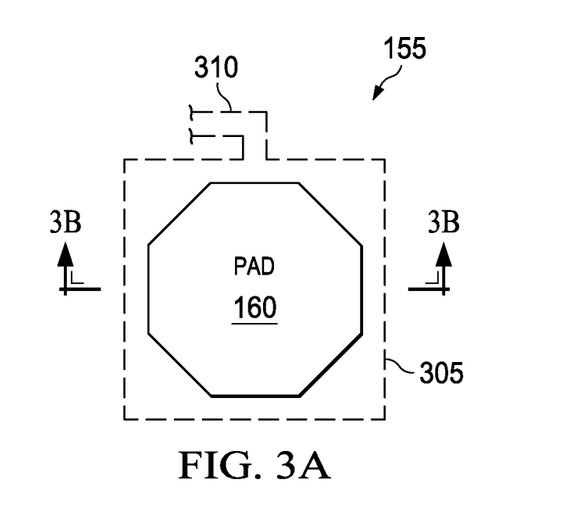
FIG. 3A is a top-down view of an example embodiment of a dual-mode filtering actuator driver pad capacitor.

FIG. 3A is a top-down view of an example embodiment of the dual-mode filtering actuator driver pad capacitor 155 of FIG. 1. Some versions of the pad capacitor 155 may include the pad 160 itself. That is, the pad capacitor 155 may include a metallic top plate 160A formed by the connector pad 160. The pad capacitor 155 may also include a metallic bottom plate 305 formed at a layer under the connector pad 160. The metallic bottom plate 305 includes an RF ground return path 310 coupled between the bottom plate 305 and the RF ground rail 125 of FIG. 1.

Figure 3B:
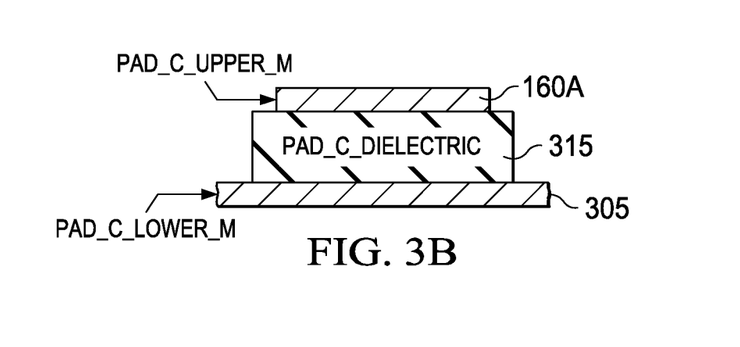
FIG. 3B is a cross-sectional view of an example embodiment of a dual-mode filtering actuator driver pad capacitor.

FIG. 3B is a cross-sectional view of the example driver pad capacitor 155. The metallic top plate 160A is separated from the metallic bottom plate 305 by a dielectric layer 315 formed between the metallic top plate 160A and the metallic bottom plate 305.

Figure 4:
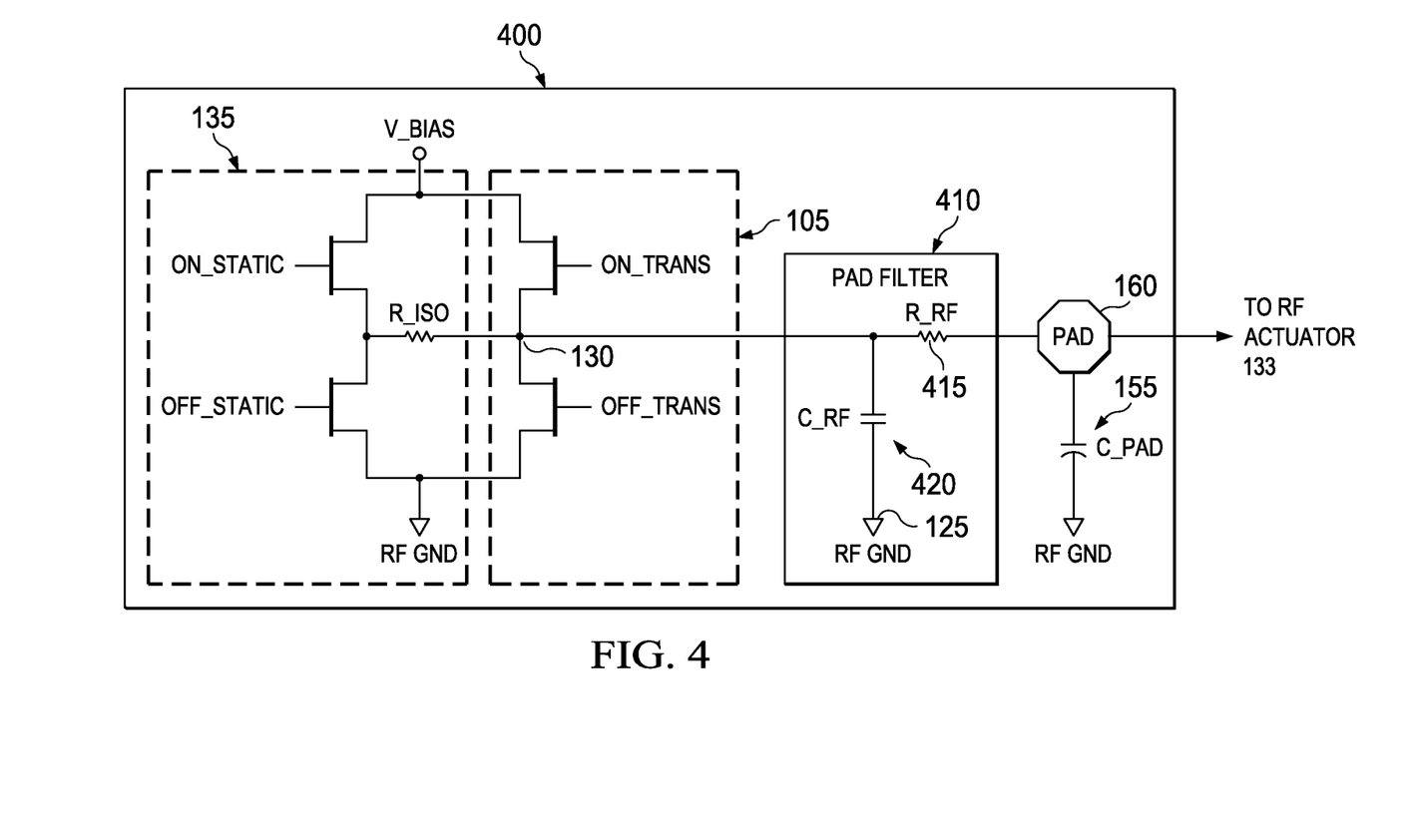
FIG. 4 is a schematic diagram of a dual-mode filtering actuator driver apparatus according to various example embodiments.

FIG. 4 is a schematic diagram of a dual-mode filtering actuator driver apparatus 400 according to various example embodiments. The actuator driver 400 includes the transition stage 105, the static stage 135, the pad capacitor 155 and the pad 160, all as described above with reference to the actuator driver apparatus 100 of FIG. 1.

The actuator driver 400 also includes an RC pad filter 410 proximate to the connector pad 160. The pad filter 410 filters RF energy from an RF actuator 133 to the actuator driver 400. The pad filter 410 includes a pad filter resistor 415 coupled in series between the connector pad 160 and a switching stage output terminal 130. The pad filter 410 also includes a metal capacitor 420 coupled between a junction of the pad filter resistor 415 with the output node 130 and the RF ground rail 125.

Figure 5A:
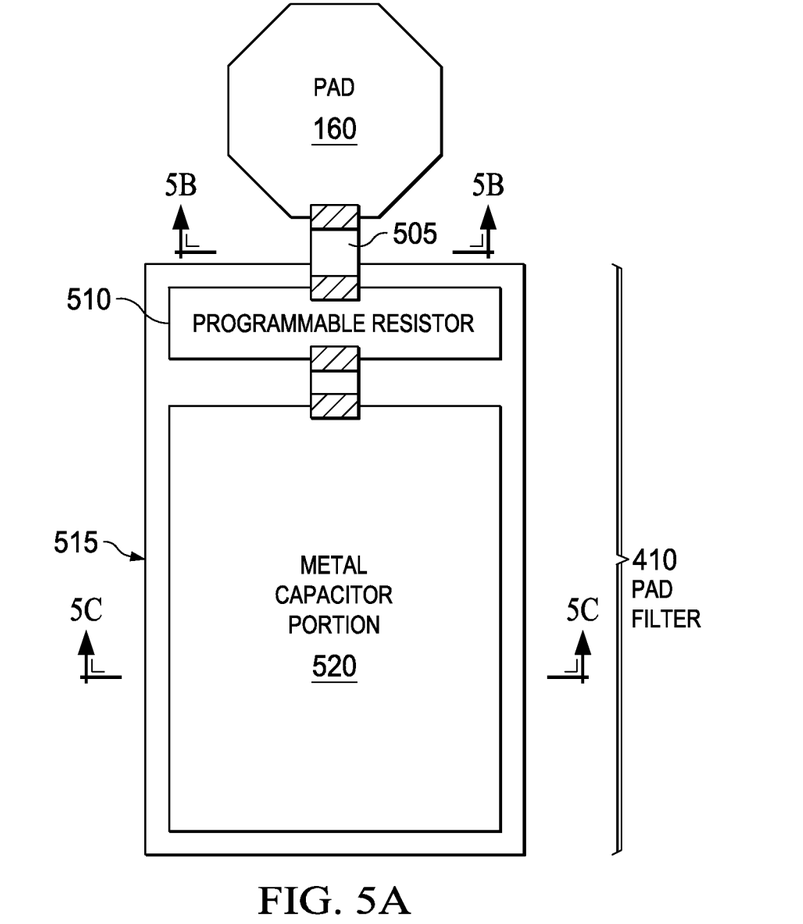
FIG. 5A is a top-down view of an example embodiment of a dual-mode filtering actuator driver connector pad and an associated pad filter implemented with semiconductor materials.

FIG. 5A is a top-down view of an example embodiment of a dual-mode filtering actuator driver connector pad 160 and an associated pad filter 410 implemented with semiconductor materials. The connector pad 160 is coupled via a shielded conductive route 505 to a resistor portion 510 of an area 515 occupied by the pad filter 410. The resistor portion 510 is coupled to a metal capacitor portion 520 of the area 515. The resistor portion 515 may include multiple resistor segments reconfigurable in various series and/or parallel combinations to provide a programmable resistance as is known in the art.

Figure 5B:
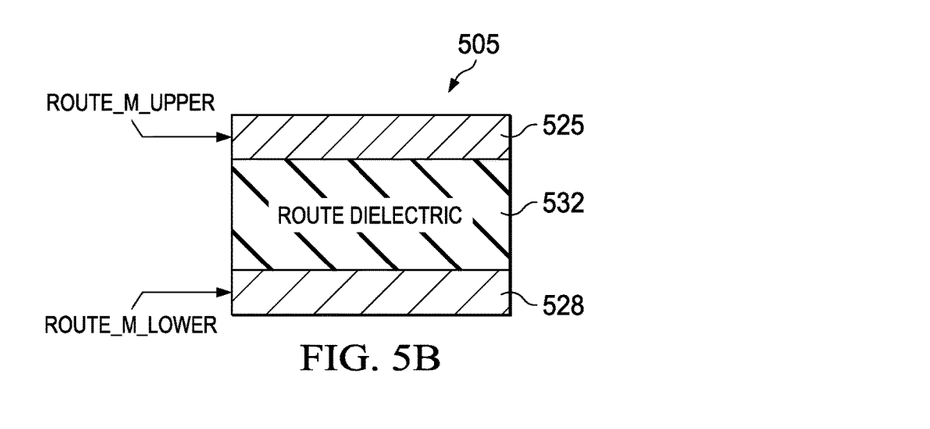
FIG. 5B is a cross-sectional view of an example embodiment of a shielded conductive route between a dual-mode filtering actuator driver connector pad and an associated pad filter resistor.

FIG. 5B is a cross-sectional view of an example embodiment of a shielded conductive route 505 between a dual-mode filtering actuator driver connector pad 160 and an associated pad filter resistor 415. The shielded conductive route 505 includes an upper metallic layer 525 to couple between the connector pad 160 and the pad filter resistor 415. The shielded conductive route 505 also includes an isolated lower metallic layer 528 to provide an RF shield to the upper metallic layer 525. The conductive route 505 further includes a route dielectric 532 formed between the upper metallic layer 525 and the isolated lower metallic layer 528.

Figure 5C:
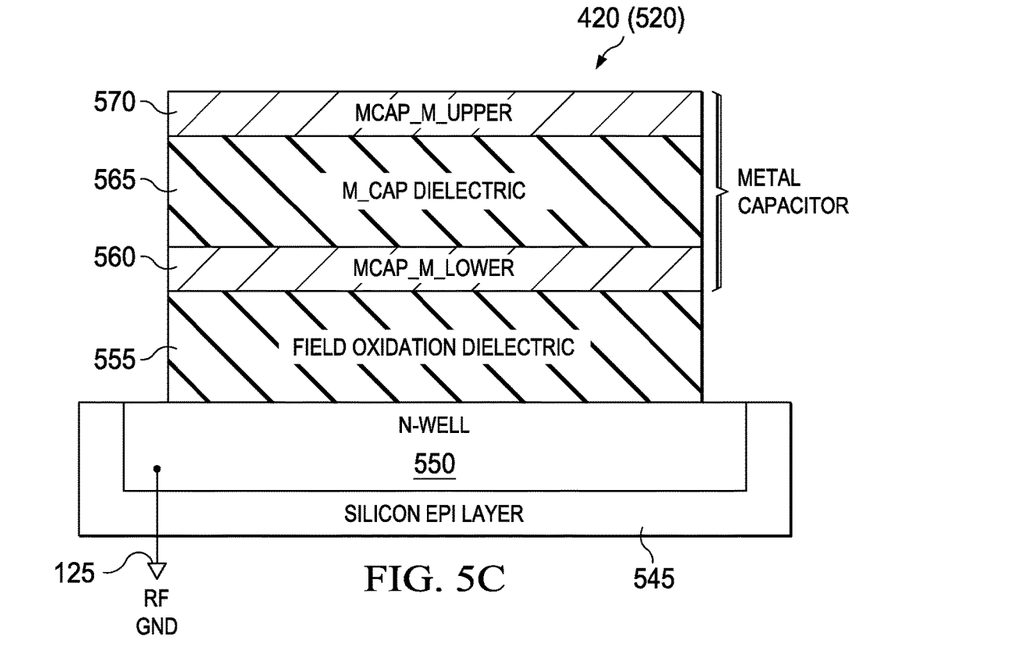
FIG. 5C is a cross-sectional view of an example embodiment of a metal capacitor portion of a pad filter associated with a dual-mode filtering actuator driver.

FIG. 5C is a cross-sectional view of an example embodiment of a metal capacitor 420 (e.g., the metal capacitor portion 520 of FIG. 5A) of a pad filter 410 associated with the dual-mode filtering actuator driver 400 of FIG. 4. The metal capacitor 420 includes a silicon epitaxial layer 545 on a silicon substrate (not shown). The metal capacitor 420 also includes an n-well 550 formed in the silicon epitaxial layer 545. The n-well 550 is coupled to the RF ground rail 125. The metal capacitor 420 also includes a field oxidation dielectric layer 555 formed on the n-well 550. The metal capacitor 420 further includes a cathode formed as a lower metallic layer 560 on the field oxidation layer 555. A metal capacitor dielectric layer 565 is formed on the lower metallic layer 560. An anode of the metal capacitor 420 is formed as an upper metallic layer 570 on the dielectric layer 565.

Figure 6:
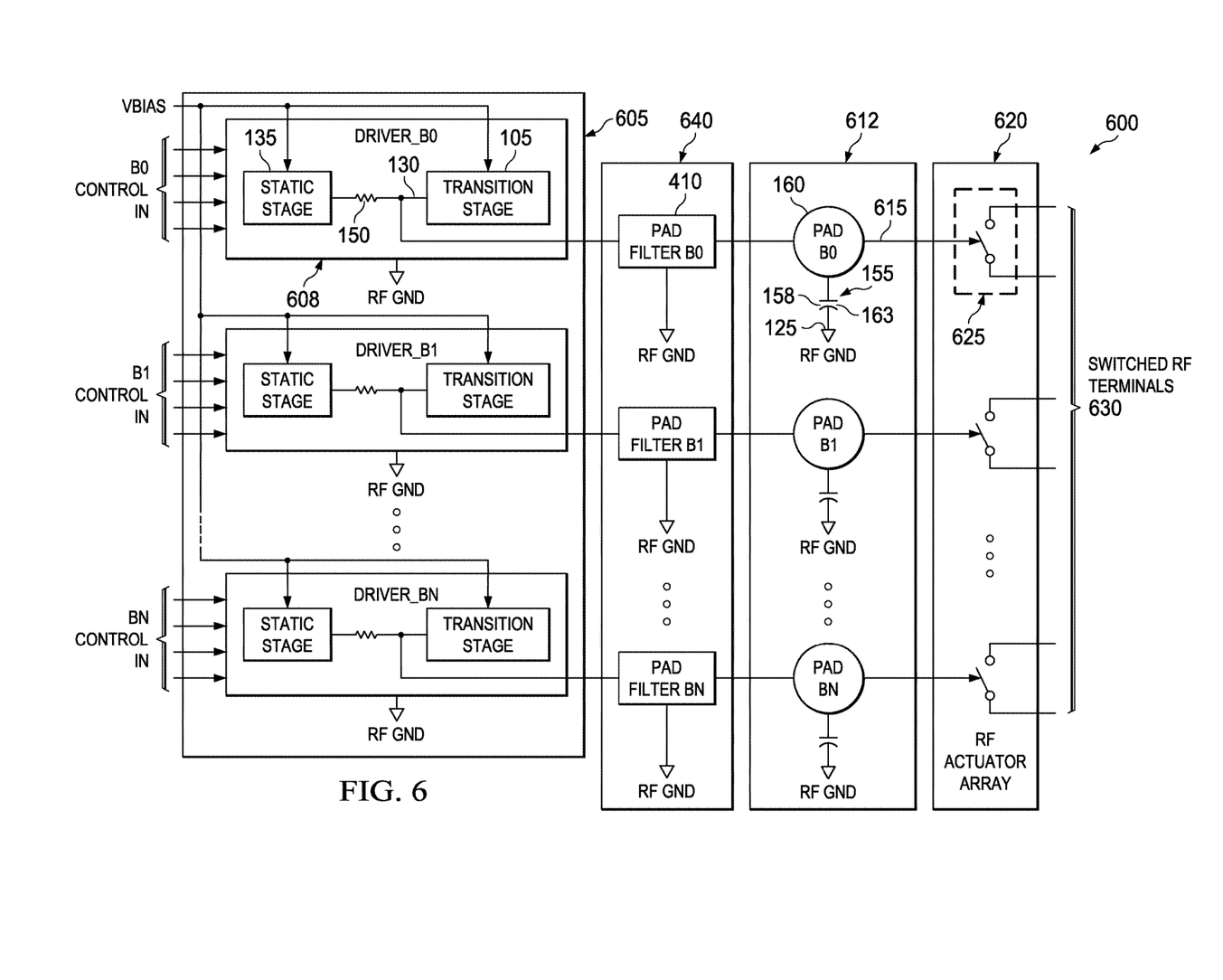
FIG. 6 is a block diagram of a dual-mode filtering actuation system according to various example embodiments.

FIG. 6 is a block diagram of a dual-mode filtering actuation system 600 according to various example embodiments. The actuation system 600 includes an array of dual-mode actuator drivers 605. Each actuator driver (e.g., the actuator driver bit zero 608) controls a state of a drive signal at the driver output. The output states include a high bias voltage state substantially equal to a voltage of a power supply voltage rail, a low voltage state substantially equal to a voltage potential of an RF ground rail, and a high impedance state.

Each actuator driver of the array 605 includes a transition stage (e.g., the transition stage 105). The transition stage initiates a state change of an associated driver output signal. The transition stage corresponding to each actuator driver includes two or more transition stage transistors coupled together as previously described above for the actuator driver 100 of FIG. 1.

Each actuator driver of the driver array 605 also includes a static stage (e.g., the static stage 135) communicatively coupled to the transition stage. The static stage maintains the state change of the driver output signal after the transition stage is quiesced as described above. The static stage corresponding to each actuator driver includes two or more transition stage transistors coupled together as previously described above for the actuator driver 100 of FIG. 1.

Each actuator driver of the array 605 further includes an isolation resistor (e.g., the isolation resistor 150). The isolation resistor couples the output signal from the static stage to an output node (e.g., the output node 130) of the actuator driver during a static mode of operation.

The dual-mode filtering actuation system 600 also includes an array of pad capacitors 612. Each pad capacitor of the array 612 (e.g., the pad capacitor 155) includes a first terminal (e.g., the terminal 158) at a connector pad (e.g., the connector pad 160) communicatively coupled to the corresponding output node (e.g., the output node 130). Each pad capacitor also includes a second terminal (e.g., the terminal 163) coupled to an RF ground rail 125. The isolation resistor and the pad capacitor associated with a particular actuator driver form a low-pass filter. The low-pass filter filters RF harmonics from the actuator driver to actuator circuitry and filters RF energy generated outside of the actuator driver at the actuator driver output (e.g., at the output 615).

The actuation system 600 further includes an array of RF actuator elements 620. A state of each element (e.g., the switching element 625) of the RF actuator array is controlled by a corresponding actuator driver in the actuator driver array 605. The RF actuator array elements act upon RF signals at the output terminals 630 of the actuator array 620. An array of RF switching elements, for example, selectively switches RF signals at the output terminals 630.

Although the actuator elements in the example RF actuator array 620 are shown as switching elements, the array elements may be of various types including RF switches, tunable inductors, switched capacitors and/or varactors. A varactor array may, for example, selectively change the phase of RF signals presented at the array output terminals 630. The actuator array 620 may in some embodiments be implemented as a MEMS array such as a MEMS RF switching array, a MEMS tunable inductor array, a MEMS capacitor array, a MEMS switched capacitor array, and/or a MEMS varactor array.

Some versions of the dual-mode filtering actuation system 600 also include an array of RC low-pass pad filters 640 to provide additional filtering of RF energy that might otherwise enter the driver array 605 from the actuator array 620. Each RC pad filter (e.g., the pad filter 410) is situated proximate to a corresponding connector pad (e.g., the connector pad 160). Each RC pad filter filters RF energy from a corresponding actuator element (e.g., the actuator element 625) to a corresponding actuator driver (e.g., the driver 608). Each pad filter is constructed as previously described with reference to FIGS. 4, 5A, 5B and 5C.

Figure 7:
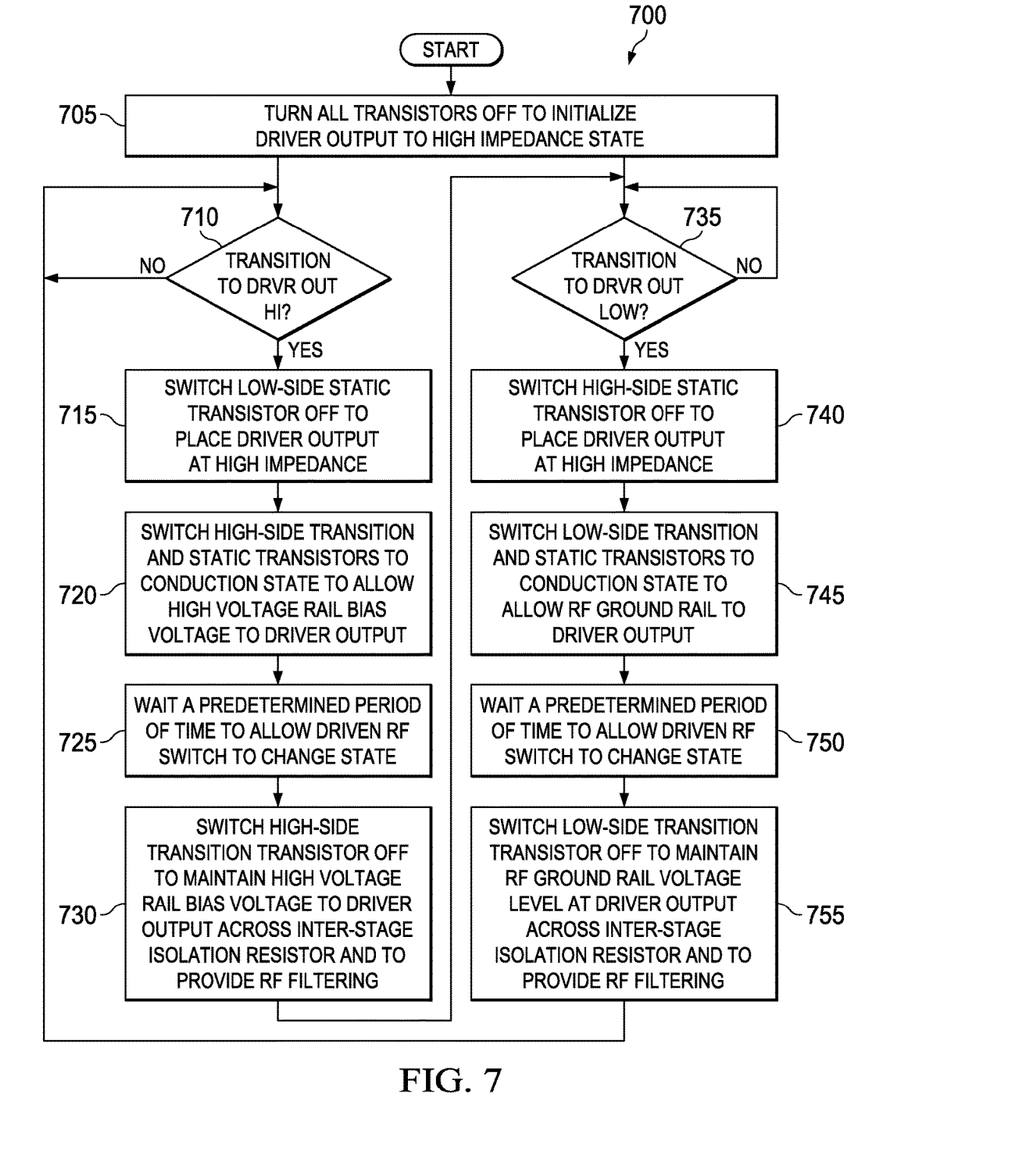
FIG. 7 is a flow diagram illustrating a method of generating a filtered actuator control signal according to various example sequences.

FIG. 7 is a flow diagram illustrating a method 700 of generating a filtered actuator control signal according to various example sequences. The method 700 describes sequences of activities performed by the dual-mode filtering actuator driver apparatus 100 described above with reference to FIG. 1. The method 700 includes transitioning to a high voltage state or an RF ground state from a high impedance state at the driver output node using a transition stage of the driver. The method 700 also includes disabling the transition stage and maintaining the selected state at the output node through an isolation resistor using the static stage. The method 700 further includes filtering RF noise at the output node using the isolation resistor and a capacitor coupled between a pad connector associated with the output node and the RF ground rail as further described in detail below.

The method 700 commences at block 705 with switching all actuator driver transistors to a non-conductive state to initialize the output node in the high impedance state. The method 700 continues at blocks 710 and 735 with determining whether to transition the driver output to a high or a low state, respectively.

If a decision is made to transition to output high, the method 700 includes switching the low-side static transistor off at block 715 to ensure that the output is in a high impedance state and to avoid a rail-to-rail crowbar current through the static stage in case the high-side static transistor is on. The method 700 also includes switching the high-side transition and static transistors to a conduction state to allow high voltage rail bias voltage to the driver output, at block 720. The method 700 further includes waiting a predetermined period of time to allow the driven RF actuator to change state, at block 725. The method 700 also includes switching the high-side transition transistor off following expiration of the predetermined RF actuator settling time, at block 730. Doing so maintains the high voltage rail bias to the driver output across the inter-stage isolation resistor. RF filtering is provided by the isolation resistor in RC combination with a capacitance at a driver output connector pad.

If a decision is made to transition to output low, the method 700 includes switching the high-side static transistor off at block 740 to ensure that the output is in a high impedance state and to avoid a rail-to-rail crowbar current through the static stage in case the low-side static transistor is on. The method 700 also includes switching the low-side transition and static transistors to a conduction state to allow RF ground potential to the driver output, at block 745. The method 700 further includes waiting a predetermined period of time to allow the driven RF actuator to change state, at block 750. The method 700 also includes switching the low-side transition transistor off following expiration of the predetermined RF actuator settling time, at block 755. Doing so maintains the RF ground potential at the driver output across the inter-stage isolation resistor. RF filtering is provided by the isolation resistor in RC combination with the capacitance at the driver output connector pad.

Apparatus, systems and methods described herein may be useful in applications other than controlling RF actuators while filtering noise to and from the actuators and associated drivers. The examples of the apparatus 100 and 400, the system 600 and the method 700 described herein are intended to provide a general understanding of the structures of various embodiments and the sequences of various methods. They are not intended to serve as complete descriptions of all elements and features of systems and methods that might make use of these example structures and sequences.

Structures and methods disclosed herein provide initial transition and then statically held drive signals to an RF actuator device or to an array of RF actuator devices such as may be included in a MEMS array. An inter-stage isolation resistor and a capacitor formed at the driver output connector pad form an RC low-pass filter to block spurious noise generated at the driver and/or within the switching circuitry associated with the driver high voltage power supply. The RC low-pass filter also filters RF energy from the RF actuator that might otherwise enter into and disrupt operation of the actuator driver. Some embodiments include an additional RC filter proximate to the output connector pad to block high levels of RF energy that may be present at an actuator device. The dual-mode driver character and integral filtering provided by these structures and methods increase reliability of actuator switching in a small form-factor.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. An actuator driver apparatus, comprising:
   a transition stage including at least two transition stage transistors, the at least two transition stage transistors having a first current path coupled in series between a power supply voltage rail and a radio frequency ("RF") ground rail, the at least two transition stage transistors joined at an output node, at least one of the at least two transition stage transistors to conduct during a state change at the output node and to be turned off at an end of a predetermined period of time after the state change;
   a static stage communicatively coupled to the transition stage, the static stage including at least two static stage transistors, the at least two static stage transistors having a second current path coupled in series between the power supply voltage rail and the RF ground rail and joined at an isolation node, at least one of the at least two static stage transistors to continue to conduct following the predetermined period of time after the state change in order to maintain the state change after the transition stage becomes inactive;
   an isolation resistor coupled between the isolation node and the output node; and
   a pad capacitor with a first terminal at a connector pad communicatively coupled to the output node and a second terminal coupled to the RF ground rail, the isolation resistor and the pad capacitor to form a low-pass filter to filter RF harmonics from the actuator driver apparatus to actuator circuitry and to filter RF energy generated outside of the actuator driver apparatus to the connector pad.

2. The actuator driver apparatus of claim 1, wherein the actuator circuitry is an element of a micro-electromechanical ("MEMS") array.

3. The actuator driver apparatus of claim 2, wherein the MEMS array is a selected one of a group consisting of a MEMS RF switching array, a MEMS tunable inductor array, a MEMS capacitor array, a MEMS switched capacitor array, and a MEMS varactor array.

4. The actuator driver apparatus of claim 1, wherein a voltage associated with the power supply voltage rail is substantially equal to an actuation bias voltage associated with the actuator circuitry.

5. The actuator driver apparatus of claim 1, the pad capacitor further comprising:
   a metallic top plate formed by the connector pad;
   a metallic bottom plate formed at a layer under the connector pad; and
   a dielectric layer formed between the metallic top plate and the metallic bottom plate.

6. The actuator driver apparatus of claim 1, further comprising:
   a resistance/capacitance ("RC") pad filter proximate to the connector pad to filter RF energy from the actuator circuitry to the actuator driver apparatus.

7. The actuator driver apparatus of claim 6, the RC pad filter further comprising:
   a pad filter resistor coupled to the connector pad; and
   a metal capacitor coupled between the pad filter resistor and the RF ground rail.

8. The actuator driver apparatus of claim 7, the metal capacitor further comprising:
   a silicon epitaxial layer on a silicon substrate;
   an n-well formed in the silicon epitaxial layer, the n-well coupled to the RF ground rail;
   a field oxidation dielectric layer formed on the n-well;
   a cathode of the metal capacitor formed as a lower metallic layer on the field oxidation layer;
   a metal capacitor dielectric layer formed on the lower metallic layer; and
   an anode of the metal capacitor formed as an upper metallic layer on the metal capacitor dielectric layer.

9. The actuator driver apparatus of claim 6, further comprising:
   a shielded conductive route to couple the connector pad to the pad filter resistor.

10. The actuator driver apparatus of claim 9, the shielded conductive route further comprising:
    an upper metallic layer to couple between the connector pad and the pad filter resistor;
    an isolated lower metallic layer to provide an RF shield to the upper metallic layer; and
    a route dielectric formed between the upper metallic layer and the isolated lower metallic layer.

11. A method of generating a filtered radio frequency ("RF") actuator control signal at an actuator driver including a transition stage and a static stage, the transition stage including a high-side transition transistor coupled between a high voltage power supply rail and a driver output node and a low-side transition transistor coupled between the driver output node and an RF ground rail and the static stage including a high-side static transistor coupled between the high voltage power supply rail and an isolation node and a low-side static transistor coupled between the isolation node and the RF ground rail, an isolation resistor coupled between the output node and the isolation node, the method comprising:

from a high impedance state at the output node, transitioning to a selected one of a high voltage state or an RF ground state using the transition stage;

disabling the transition stage;

maintaining the selected state at the output node through the isolation resistor using the static stage; and filtering RF noise at the output node using the isolation resistor and a capacitor coupled between a pad connector associated with the output node and the RF ground rail.

12. The method of generating a filtered RF actuator control signal of claim 11, further comprising:

switching the high-side transition transistor, the low-side transition transistor, the high-side static transistor and the low-side static transistor to a non-conductive state to place the output node in the high impedance state.

13. The method of generating a filtered RF actuator control signal of claim 11, transitioning the output node to the high voltage state further comprising:

switching the high-side transition and high-side static transistors to a conduction state to allow a high voltage rail bias voltage to the output node;

waiting a predetermined period of time to allow an RF actuator to be driven by the RF actuator control signal to change state; and switching the high-side transition transistor to a non-conductive state to maintain the high voltage rail bias voltage at the output node across the isolation resistor.

14. The method of generating a filtered RF actuator control signal of claim 11, transitioning the output node to the RF ground state further comprising:

switching the low-side transition and low-side static transistors to a conduction state to allow an RF ground potential to the output node;

waiting a predetermined period of time to allow an RF actuator to be driven by the RF actuator control signal to change state; and switching the low-side transition transistor to a non-conductive state to maintain the RF ground potential at the output node across the isolation resistor.

* * * * *